United States Patent
Cooke (10) Patent No.: US 8,339,824 B2
(45) Date of Patent: Dec. 25, 2012

(54) NEAREST NEIGHBOR SERIAL CONTENT ADDRESSABLE MEMORY

(76) Inventor: Laurence H. Cooke, Aptos, CA (US)

(*) Notice: Subject to any disclaimer, the term of this patent is extended or adjusted under 35 U.S.C. 154(b) by 1208 days.

(21) Appl. No.: 12/166,960

(22) Filed: Jul. 2, 2008

(65) Prior Publication Data

US 2010/0005254 A1    Jan. 7, 2010

(51) Int. Cl.
*G11C 15/00* (2006.01)
(52) U.S. Cl. ........................ 365/49.1; 365/49.17
(58) Field of Classification Search ............... None
See application file for complete search history.

(56) References Cited

U.S. PATENT DOCUMENTS

| | | | | |
|---|---|---|---|---|
| 5,053,991 | A * | 10/1991 | Burrows | 365/49.17 |
| 5,218,562 | A * | 6/1993 | Basehore et al. | 708/422 |
| 6,389,579 | B1 | 5/2002 | Phillips et al. | |
| 6,999,331 | B2 | 2/2006 | Huang | |
| 7,003,624 | B2 * | 2/2006 | Regev et al. | 711/108 |
| 7,113,416 | B2 * | 9/2006 | Koide et al. | 365/49.1 |
| 7,369,422 | B2 | 5/2008 | Cooke | |

OTHER PUBLICATIONS van de Panne et al., "MACHAM: A Best Match Content Addressable Memory," Jun. 1989, IEEE Pacific Rim Conference on Communications, Computers and Signal Processing. pp. 612-615.*
Oike et al., "A Word-Parallel Digital Associative Engine with Wide Search Range Based on Manhattan Distance," Oct. 2004, IEEE 2004 Custom Integrated Circuits Conference. pp. 295-298.*
Athavale et al. "High-Speed Serial I/O Made Simple: A Designer's Guide, with FPGA Applications," Apr. 2005, XILINX. Edition 1.0. Selected excerpts. 8 pages.*

* cited by examiner

*Primary Examiner* — Alexander Sofocleous
(74) *Attorney, Agent, or Firm* — Connolly Bove Lodge & Hutz LLP (57) ABSTRACT

A digital design and technique may be used to implement a Manhattan Nearest Neighbor content addressable memory function by augmenting a serial content addressable memory design with additional memory and counters for bit serially accumulating in parallel and subsequently comparing in parallel all the Manhattan distances between a serially inputted vector and all corresponding vectors resident in the CAM. Other distance measures, besides a Manhattan distance, may optionally be used in conjunction with similar techniques and designs.

19 Claims, 5 Drawing Sheets

NEAREST NEIGHBOR SERIAL CONTENT ADDRESSABLE MEMORY

FIELD OF THE INVENTION

Embodiments of the present invention pertain to a serially-addressed content-addressable memory to select the closest neighbor between the contents of memory and the serially-inputted content. Nearest neighbor determination may use a modified Manhattan distance calculation.

BACKGROUND OF THE INVENTION

Numerous examples of content addressable memories (CAMs) exist, including U.S. Pat. No. 6,999,331, granted Feb. 14, 2006 to Huang; U.S. Pat. No. 6,389,579, granted May 14, 2002 to Phillips et al.; as well as a serial CAM; U.S. Pat. No. 7,369,422 granted May 6, 2008 to Cooke. They all refer to providing output associated with the occurrence of data that is equivalent to the data inputted into the CAM. Most CAMs compare all inputted bits, with all corresponding bits, in all words, in memory, in parallel. Cooke's serial CAM serially compares each inputted bit of data with all the corresponding bits of data in all words in memory. The current state of comparison is retained for each word as the CAM proceeds serially through all the bits in memory.

Traditionally, CAMs have been used in computer cache, virtual address translation and routers, but not in more computationally intense "fuzzy" applications such as visual identification or speech recognition, both of which require some form of best-fit selection. Furthermore, historically these types of pattern recognition applications have been computationally expensive and slow.

SUMMARY OF EMBODIMENTS OF THE INVENTION

This disclosure describes specific examples of augmenting the simple parallel comparison function of a serial CAM by manipulating the order of the serial input and the contents of the serial CAM memory to minimize the logic needed to perform parallel operations between the input and each item in memory. More specifically, it describes ways to organize and serially access the data within a high-density digital memory (e.g., static random access memory (SRAM) or dynamic random access memory (DRAM) in a bit parallel fashion, for the purposes of translating ordered and serially inputted data into a value associated with a vector in the digital memory that is a nearest neighbor to the inputted vector. In one case, a Hamming distance function may be applied to data, which may consist of a collection of Boolean attributes, and in another case, a Manhattan distance function may be applied to vector data, which may consist of a set of integer values.

To accomplish this, a serial CAM may be augmented to accumulate, in parallel, measures that are related to the distances between the inputted vector and every vector in the digital memory. This augmented serial CAM may then output a value associated with the vector in memory that has the lowest measure, which is the nearest neighbor to the inputted vector. The criterion for determining the nearest neighbor may be a Manhattan distance metric.

The vectors in memory, like the inputted vector, may be comprised of K n-bit integers, and may be organized in n K-bit groups, each group containing one bit of equivalent significance from each integer, and the K-bit groups may be ordered from most significance to least significance, allowing each integer in memory to be compared with the corresponding inputted integer, in order, from the most significant bit to the least significant bit. The Manhattan nearest neighbor may then be determined by calculating the sums of the absolute values of the differences between the inputted vector's coordinate values and the corresponding coordinate values of all the vectors in memory, and choosing the smallest sum. This Manhattan distance calculation may be performed in parallel between a properly order input vector and each vector in memory by:

a. Comparing the corresponding coordinate values of the input and memory vectors in order from most to least significant bit,
b. Saving the sign of the most significant bit of the differences between the corresponding values of each pair of input and memory vectors,
c. For each bit of significance, summing the products of the sign from step (b) and that value's bit of difference with all the other corresponding bits of differences, and
d. In order from the most to least significant bit, successively doubling the cumulative result and adding the values from step (c).

After the input vector has been completely serially inputted, the cumulated differences may be successively compared, one bit at a time, until one least distance remains, or until there is no difference between the input vector and one or more vectors in memory.

In other words, the Manhattan distance between a properly formatted input vector and each of a set of corresponding vectors in memory, each with K coordinate values, may be calculated in parallel, using one K-bit compare register, one K-bit sign register and one counter/shifter for each word in the memory. The Manhattan nearest neighbor of an appropriately ordered input vector out of a set of similarly ordered vectors in memory may be calculated by: bit serially comparing, successively capturing the sign of the difference, accumulating the differences between the inputted vector and each vector in memory, and selecting the least of the calculated differences within one or more clock cycles following loading the last bit of the input vector.

BRIEF DESCRIPTION OF THE DRAWINGS

Embodiments of the invention will now be described in connection with the attached drawings, in which.

DESCRIPTION OF VARIOUS EMBODIMENTS

Various embodiments of the present invention is now described with reference to FIGS. 1-6, it being appreciated that the figures illustrate various aspects of the subject matter and may not be to scale or to measure.

An embodiment of the present invention may be an augmented serial content addressable memory comprising an orthogonal memory containing the set of vectors to compare, comparison logic to detect one or more matches, a memory to hold intermediate sign information, and a counter for each vector in memory to hold a portion of a distance calculation between the inputted vector and the corresponding vector from the orthogonal memory.

Figure 1:
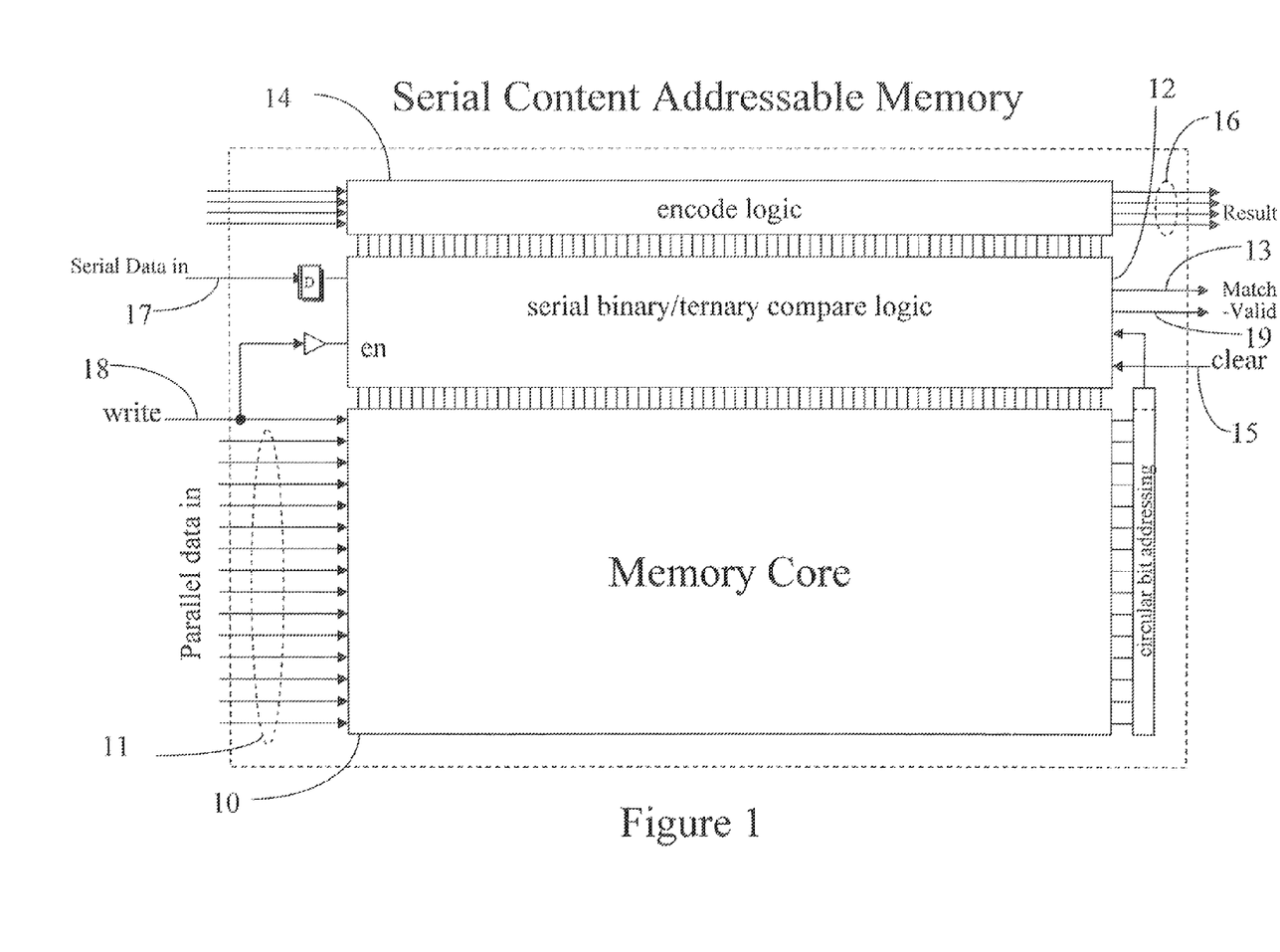
FIG. 1 is a diagram of a serial CAM with parallel write capability.

Reference is now made to FIG. 1, a diagram of a binary/ternary serial CAM with parallel write capability. In this embodiment, an orthogonal memory core 10 includes a parallel data in port 11 for writing data into the memory. The address lines for writing the parallel data into the memory are perpendicular to the parallel data in lines and originate in the compare logic module 12. The bit address lines select a bit from each word read into the compare logic module 12, which contains compare logic for each word that selects, from the encode logic 14, a result 16 to be outputted after the data inputted via the Serial-Data In 17 matches the contents in the Memory Core 10.

The Clear 15 and Write 18 signals control the addition and deletion of data in the Memory Core. Without altering or elaborating on the methods to add and delete data from the Memory core, this structure may be augmented to select the nearest neighbor of the inputted data from the points in memory.

Figure 2:
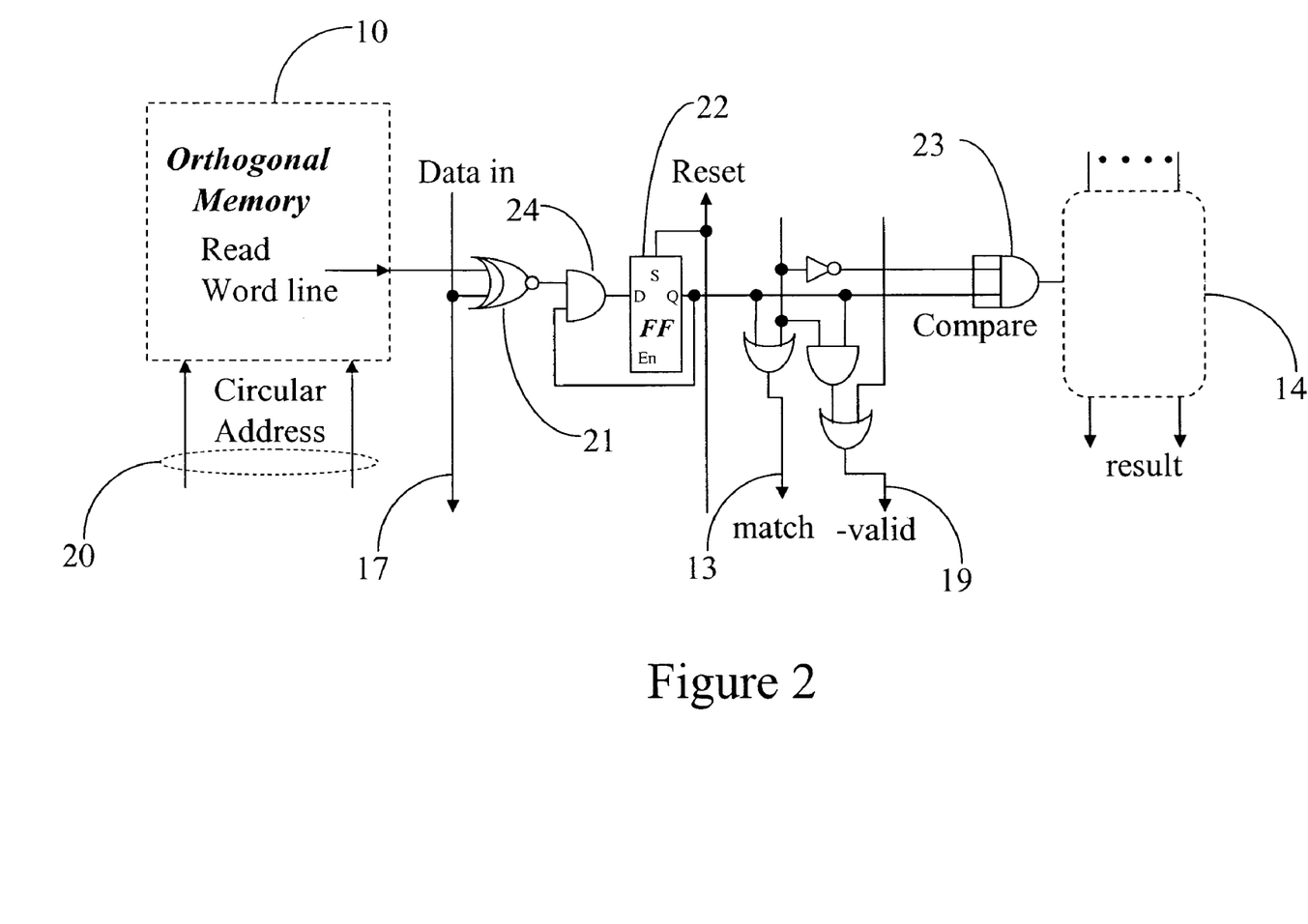
FIG. 2 is a simplified diagram of compare logic for a word of a serial CAM.

Reference is now made to FIG. 2, a simplified diagram of compare logic for a word of a serial CAM. The circular address 20 may be used to select one bit from all the words in the orthogonal memory 10, for example, progressing serially from the first to the last bit in memory. Each bit may be compared via an XNOR gate 21 with the bit value from the Serial Data In 17. If the values do not match, the Flip-flop 22 may then be reset and the AND gate 24 may function to keep it reset until the end of the compare. After the last bit has been compared, the match 13 signal may then be high if at least one match has occurred, and the -valid 19 signal may be high if more than one match has occurred. If at least one match has occurred, the AND gate 23 may select the encode logic 14 for the first match in memory.

The CAM logic described above may be augmented to perform a nearest neighbor selection, for example, by reordering the contents of the orthogonal memory 10 and the serially inputted data into a form suitable for parallel computation and adding additional comparison logic.

Typically, finding the nearest neighbor to a particular point in a mathematical space involves evaluation of a distance metric between vectors representing those points. The well-known Euclidean distance between two points in a K-dimensional space is the square root of the sum of the squares of the differences between the coordinates in each of the K dimensions.

Another simpler distance metric is the Hamming distance. The Hamming distance between a K bit logical vector in memory and a serially inputted K bit input vector, may be calculated by summing the differences between the corresponding K bits.

Yet another distance metric that is similar to, but simpler than Euclidean distance is the Manhattan distance, which is so called because to get from one point to another in Manhattan, one must follow the streets, which are laid out on an X-Y grid. The Manhattan distance is generally calculated by the summing the absolute values of the differences of the coordinates in the K-dimensional space. The discussion will now focus on the use of the Manhattan distance metric, and coordinates that are represented as binary integers, but it should be understood that the invention is not limited to this metric or coordinate representation and that other suitable metrics and representations of coordinates may be used.

With respect to various embodiments of this invention, a Manhattan Distance measure, mathematically is the sum of the absolute values of the differences between the inputted vector's coordinate values and the corresponding coordinate values of each of the vectors in memory. The absolute value of the difference between two binary numbers is the absolute value of the sum of the differences of the bits of corresponding significance. For example, given two n-bit binary values X and Y, the absolute value of their difference is: $|(X_n-Y_n)*2^n+(X_{n-1}-Y_{n-1})*2^{n-1}\ldots+(X_0-Y_0)*2^0|$.

This difference may be simplified because it is zero until bit j, the first bit that does not match. The difference may then be expressed as $|(X_j-Y_j)*2^j \ldots +(X_0-Y_0)|$; but this is equal to $(X_j-Y_j)*2^j \ldots +(X_0-Y_0)$, if X-Y is positive, and $-(X_j-Y_j)*2^j \ldots -(X_0-Y_0)$, if X-Y is negative. Taking this one step further, X-Y is positive if $X_j-Y_j$ is positive, and X-Y is negative if $X_j-Y_j$ is negative. So, if we call the sign of the difference $S(X-Y)=X_j-Y_j$ where j is the most significant bit such that $X_j-Y_j \neq 0$, then for memory vectors comprised of coordinate values X=[A, B ... K] and the inputted vectors comprised of coordinate values X=[A, B ... K], the sum of the absolute value of the differences may be calculated as:

Manhattan $$Distance(X, \underline{X}) = [ \ldots [S(A - \underline{A})(A_j - \underline{A}_j) + S(B - \underline{B})(B_j - \underline{B}_j) + \ldots S(K - \underline{K})(K_j - \underline{K}_j)]*2 + S(A - \underline{A})(A_{j-1} - \underline{A}_{j-1}) + S(B - \underline{B})(B_{j-1} - \underline{B}_{j-1}) + \ldots S(K - \underline{K})(K_{j-1} - \underline{K}_{j-1})]*2 + \ldots S(A - \underline{A})(A_0 - \underline{A}_0) + S(B - \underline{B})(B_0 - \underline{B}_0) + \ldots S(K - \underline{K})(K_0 - \underline{K}_0)].$$

Figure 3:
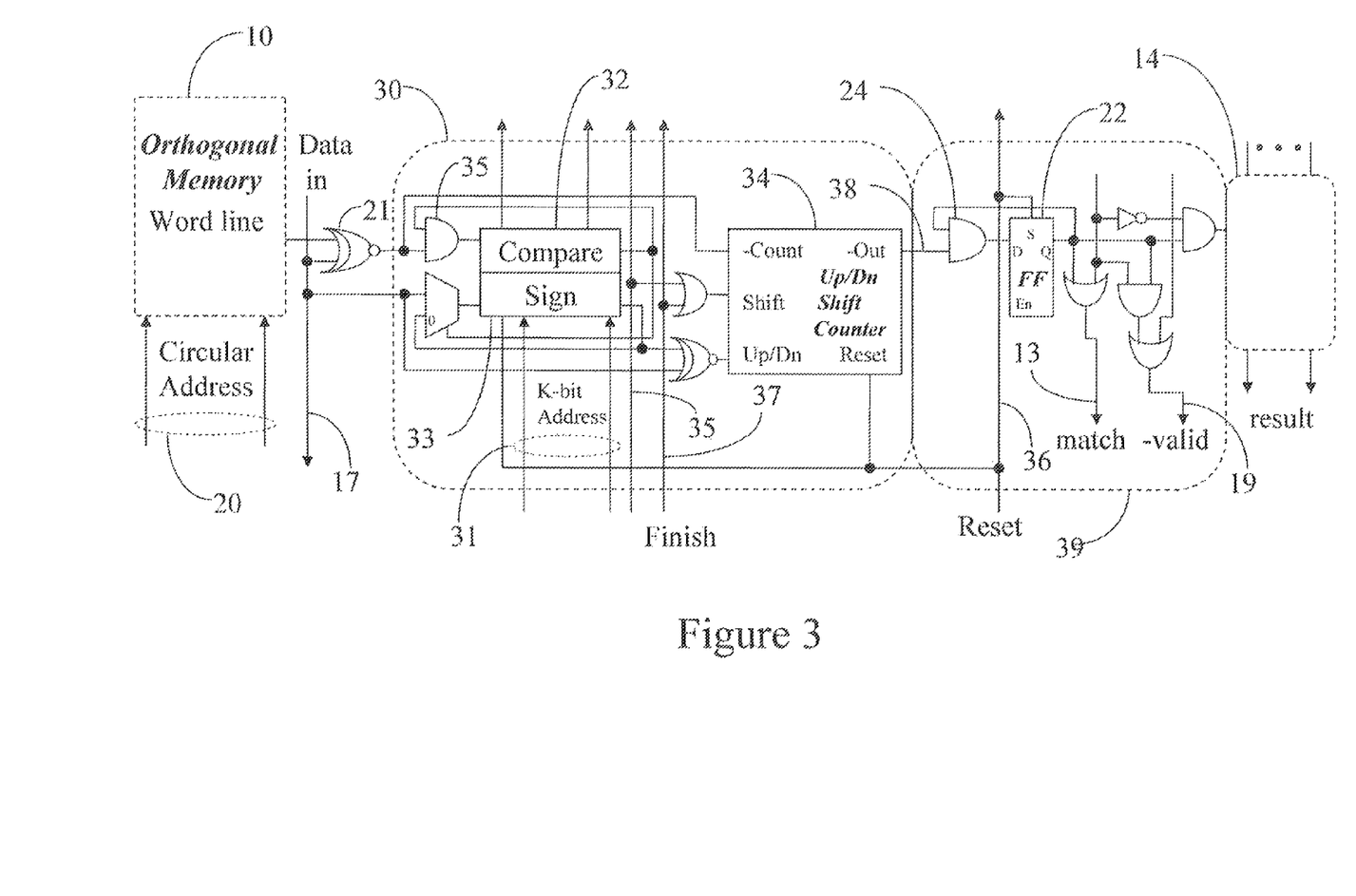
FIG. 3 is a diagram of a slice of serial CAM compare and encode logic augmented with additional logic for a Manhattan Nearest Neighbor calculation.

Reference is now made to FIG. 3, a diagram of serial CAM encode logic 14 and compare logic 39 augmented with additional logic 30 for a Manhattan Nearest Neighbor calculation, inserted between the bit comparison XNOR 21 and the AND gate 24. The additional logic 30 may include a K-bit Compare register 32, a K-bit Sign register 33 and an up/down/shift counter 34. On each clock cycle, one bit out of the Compare register 32 and one bit out of the Sign register 33 may be enabled by one of the K circular address lines 31, for reading and updating. After every K cycles, the K+1 cycle may set the last address line 35 high to enable shifting the result in the counter 34.

To begin, the Reset line 36 may be used to reset the counter 34 to zero, to set the compare flip-flop 22 to one, and to set all the bits in the compare 32 and sign 33 registers to one. Thereafter, as long as the input data 17 matches the data from the orthogonal memory 10 the counter 34 may not count. The first time a pair of bits in one of the K pairs of values does not match, a zero may then be written into the compare register 32. Thereafter the zero may be held in that location of the compare register by the recycling AND gate 35. In this way the compare register 32 contains the current state of the K separate comparisons between the input vector and the vector in memory. The compare register's 32 output may be used to determine whether the Sign register's 33 contents are updated or preserved, so that the sign register 33 may preserve the input value of the first mismatch only. Thereafter, the sign register may contain the sign of the difference, which may be used to instruct the counter 34 to either count up or count down on a mismatch. When the values on the Data in 17 and from the Orthogonal Memory 10 match, the result of the XNOR 21 is one, which may be inputted into the -count input of the counter 34 so that the counter doesn't count. Prior to the beginning of the next K cycles, which corresponds to the bits of next lowest significance with respect to the current bits (i.e., corresponding to a value of half the value represented by the current bits), the existing difference may be multiplied by 2. This is accomplished on every K+1 clock cycle when the K+1 circular address line 35 is set high, which may be used to cause a single shift in the counter 34. In this manner, the entire difference may be accumulated over N(K+1) cycles. Thereafter, until either a single match occurs or all counters 34 are zero, the counters' 34 bits may be shifted out in successive cycles while the finish line 37 is high. As each counter 34 shifts out a high value (-Out 38 goes low), the compare flip-flop 22 may be reset, until only one flip-flop remains set. This flip-flop may then mark the location of the contents in the Orthogonal memory 10 that may have the smallest Manhattan distance from the inputted vector.

Figure 4:
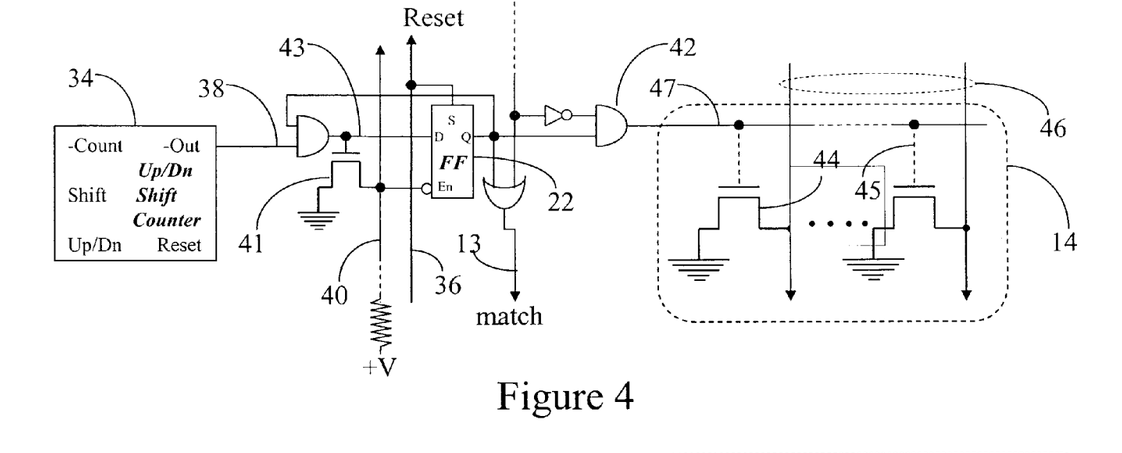
FIG. 4 is a diagram of a modified portion of the compare and encode logic.

Reference is now made to FIG. 4, a simplified diagram of modified compare and encode logic. The encode logic 14 may be comprised of multiple pre-charged result lines 46, which may be pulled down by selected transistors 44, whose gate inputs 45 may be connected to a select line 47, which may be enabled by an AND gate 42, which may serve to ensure that only the first location of a set of matching locations will be selected. The compare flip-flop 22 may be used to hold the compare status.

Figure 5:
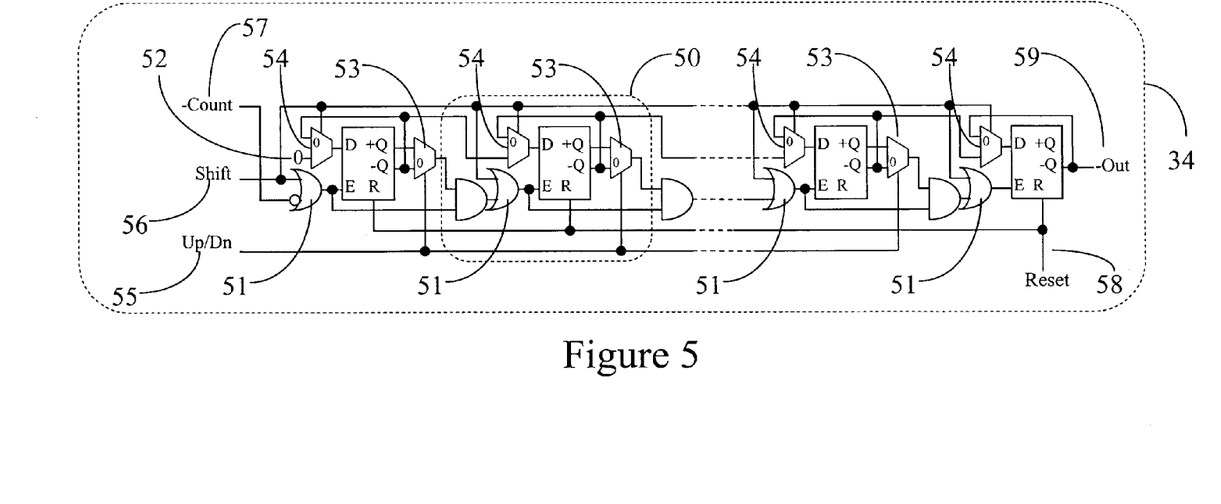
FIG. 5 is a diagram of an up/down/shift counter.

Reference is now made to FIG. 5, a diagram of the up/down/shift counter. The counter 34 may have multiple single bit stages 50 that may be connected to form a counter with the ability to shift, increment or decrement. When the Up/Dn input 55 is high, it may then control multiplexors 53 to select the positive count, and it may control multiplexors 53 to select the negative count if the Up/Dn input is low. When the -count input 57 is low, the count in the counter 34 may be incremented or decremented based on the state of the Up/Dn input 55. When shift is high, it may control multiplexors 54 that select the zero 52 and the contents of the prior flip-flop, and through OR gates 51, may enable clocking of all the stages of the counter 34 to double the count. if the counter overflows, the -Out signal 59 may then go low. The reset signal 58 may be used to clear the count in the counter 34.

Given that the vectors in memory may be K n-bit unsigned integer values, the worst-case difference would be $K*2^{n+1}-K$, which can be kept in a counter that is $(N+\log_2(K)+2)$ bits in size, but in another embodiment of the present invention, the size of the counter may be as small as $\log_2(K)+2$ bits, regardless of the size of the integer coefficients.

Reference is again made to FIG. 3, a diagram of a slice of serial CAM compare logic augmented with additional logic for a Manhattan Nearest Neighbor calculation. The counter's 34 -out signal 38 may go low if the counter 34 overflows, which may, in turn, clear the compare flip-flop 22. In other words, the compare flip-flop 22 may hold the comparison of the differences above what is held in the counters 34, so it may be possible for the counters to be only large enough to ensure that the minimum difference is selected.

To find the smallest counter, one may look at the intermediate difference calculation. The largest count for a bit group is K, which may be doubled before adding or subtracting the next-lower significance bits, so the largest and smallest values that a cumulative count of K can be after another cycle are 3K and K. Now, after another cycle, the largest and smallest 3K can become are 7K and 5K, and K can become (as before) 3K or K. So the elimination, on each cycle, of any difference above 2K would still preserve the minimum because no intermediate difference, once doubled to 4K, will ever reduce below 2K. A count of 2K can be contained in a counter of $\log_2(K)+2$ bits. Furthermore, subtracting the same constant from a set of remaining differences does not change the order of those differences.

Reference is again made to FIG. 4, a diagram of a modified portion of the compare and encode logic. Unlike a CAM, which may not contain a match to the inputted vector, there is always at least one nearest neighbor to the inputted vector, and yet the possibility exists that at any time the counter 34 shifts, all the matching words may be eliminated. This can occur if all words that have a positive compare status have their counters 34 overflow, setting their -Out signals 38 low, on the same cycle. If this occurred, without correction, all the compare flip-flops 22 would reset, no match would occur, and the minimum difference would be lost. This condition may be possible if all the differences that have not yet overflowed were to overflow at the same time. This may be avoided by including a -no match line 40, which may be pulled down by an N-channel transistor 41 if the compare status 43 is high. On the other hand, if all matches have been eliminated, all the compare status lines 43 may then be low, and the -no match line 40 may stay high, which may thus disable the compare flip-flops 22 and thus preserve their compare status values for the next cycle. This is equivalent to subtracting a constant from each of the remaining differences, which as stated above, may preserve the minimum selection calculation.

In other words, in yet another embodiment of the present invention the location of the minimum of a set of numbers, residing in memory, each with a corresponding flag, also in memory, may be found by selecting an integer m such that the maximum of the set of numbers is less than $2^m$, setting the flags of all the numbers, and performing the following until all numbers are zero:

a) double all the numbers;
b) if any number, with a flag that is set, is less than $2^m$, then
   clear the flags of all numbers greater than $2^m-1$; and
c) subtract $2^m$ from all the numbers.

The location of a minimum may then be selected from the locations with flags that are still set.

Figure 6:
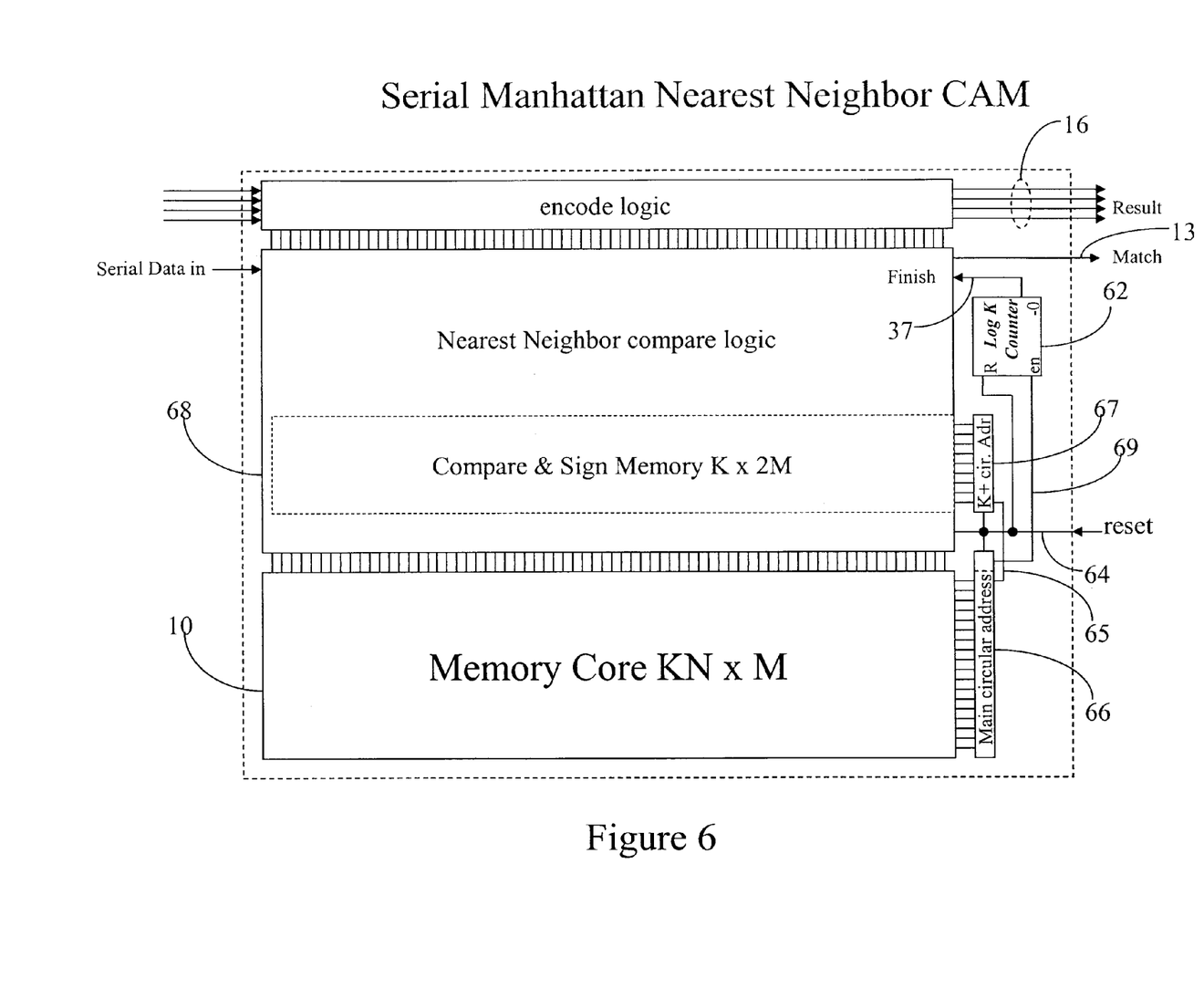
FIG. 6 is a diagram of a serial nearest neighbor CAM.

Reference is now made to FIG. 6, a diagram of a serial nearest neighbor CAM. For K n-bit integer vectors, Manhattan nearest neighbor calculations may be performed in n(K+1) cycles, and the nearest neighbors may be selected in another $\log_2(K)+2$ clock cycles after that. In addition, one initial clock cycle may be used to reset the logic. The reset signal 64 may set the circular address shift registers 65 and 67 to their first addresses and may reset the comparison logic 68 and the Log K Counter 62. For the next n(K+1) cycles, the main circular address shift register 66 may shift through the KN address lines to the Memory Core 10. After each group of K bits, the K+ circular address shift register 67 may enable a K+1 address, which may shift the differences in each of the counters, effectively doubling the differences, and may disable the Main circular address shift register 66 with a disable signal 65 for that single cycle. After the last bit line in the Memory Core 10 has been accessed, the Main circular shift register 66 may enable an NK+1 line 69, which may enable the Log K Counter 62, which may then count to $\log_2(K)+2$ and may roll over. The finish signal 37 may be designed to remain high as long as the count in the Log K counter is not zero. If there is more than one matching location when the Log K Counter 62 rolls over, the results from the first of the closest remaining nearest neighbors may be outputted on the result signals 16; however, the invention is not thus limited, and other criteria may be used for selecting which of the closest remaining nearest neighbors may be outputted.

Reference is now made to FIG. 4, a diagram of a modified portion of the compare and encode logic. Since $\log_2(K)+2$ shift cycles may occur after the last difference may have been incremented or decremented, the remaining values in the counters 34 may have been completely shifted out. If the compare flip-flop 22 is not cleared before the last shift cycle, subsequent cycles of shifting while the input and memory bits are equal may not affect the compare flip-flops 22. If multiple locations had the same minimum distance, the AND gate 42 may enable only the first select line 47.

From this it can be seen that a Manhattan Nearest Neighbor selection between an input vector consisting of K n-bit integers and a set of similarly constructed vectors in memory may be performed in no more than $n(K+1)+\log_2(K)+3$ cycles, regardless of how many vectors reside in memory.

Now in yet another simplified embodiment of the present invention, the orthogonal memory may be comprised of K 1-bit logical elements, each representing the logical presence or absence of a characteristic of an object represented by the K bit word. Serially inputting a similar input vector to the serial nearest neighbor CAM shown in FIG. 6, may result in choosing the nearest Hamming Distance neighbor after no more than $K+\log 2(K)+4$ clock cycles, because the nearest neighbor CAM may then count the number of differences between the K elements in memory and the K inputted elements and then select the resulting minimum count. It is also understood that a custom implementation for selecting the nearest neighbor solely based on a Hamming Distance metric may not require the compare or sign memories.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A digital logic device comprising:
a serial data input to the digital logic device;
a first memory circuit;
and
compare logic circuitry for respective words of said first memory circuit. wherein the compare logic circuitry for a respective, word of the first memory circuit is configured to serially accept each of all bits of the respective word and to serially compare each serially accepted bit from the respective word with a bit of serial data from the serial data input, and wherein the compare logic circuitry is configured to perform the serial comparing for the respective words of the first memory circuit in parallel.

2. The digital logic device as in claim 1, wherein said compare logic circuitry includes a shifter/counter to accumulate the comparison results.

3. The digital logic device as in claim 1, wherein the digital logic device is configured to perform said comparison and calculating the distance metric in parallel for words stored in the first memory circuit, and to perform this parallel comparison and calculating serially, for respective bits as they are input through the serial data input.

4. The digital logic device as in claim 1, wherein the digital logic device is configured to traverse the words stored in the first memory circuit in parallel, from most-significant bit (MSB) to least-significant bit (LSB), and to set a sign of the distance metric for a given word based on a first bit of the given word that fails to match a bit from the serial data input.

5. The digital logic device as in claim 1, further comprising;

a second memory circuit;
wherein said second memory circuit is configured to contain information related to said serial comparison, and
wherein said compare logic is configured to incrementally calculate a distance metric between the respective word and the bits of said serial data input, using said information related to said serial comparison.

6. The digital logic device as in claim 5, wherein said compare logic circuitry includes shifter/counter logic configured to perform one or more operations based at least in part on at least a portion of said information related to the comparison.

7. The digital logic device as in claim 5, wherein said distance metric is a Hamming distance metric.

8. The digital logic, device as in claim 5, wherein said distance metric is a Manhattan distance metric.

9. A digital logic device comprising:
a serial input to the digital logic device;
at least one memory circuit containing at least one set of items;
logic circuitry configured to perform operations ID parallel between data from said serial input and at least a subset of said set of items from at least one said memory circuit, the subset containing at least two items of said set of items, wherein the logic, circuitry is further configured to accept in parallel data of said at least a subset of said set of items to serially receive data from the serial input and to perform the parallel operations as the data from the serial input are serially received, wherein the parallel operations are performed on a common item data received from the serial input in parallel with parallel data items of said at least a subset of said set of items:
wherein said logic circuitry is further configured based on a serial ordering used to order data inputted into said serial input.

10. The digital logic device as in claim 9, wherein an input vector to the logic circuitry is ordered into groups of bits, one bit from each coordinate of an item associated with said set of items, in order from most to least significant bit.

11. The digital logic device as in claim 9, wherein said items in said set of items are ordered into groups of bits, one bit from each coordinate of an item, in order from most to least significant bit.

12. A digital logic device comprising:
a serial dam input to the digital logic device;
a serial content-addressable memory (CAM) circuit;
a second memory circuit; and
compare logic circuitry for each word of said serial CAM circuit;
wherein said second memory circuit is configured to contain information reflecting a result of a comparison of a portion of data from said serial CAM and said serial data input, and wherein said compare logic circuitry incrementally calculates a distance metric between said data from said serial CAM and said serial data input, using said information reflecting the result the comparison.

13. The digital logic device as in claim 12, wherein said compare logic circuitry includes shifter/counter logic configured to perform one or more operations based at least in part on at least a portion of said information reflecting the result of the comparison.

14. The digital logic device as in claim 13, wherein said distance metric is a Hamming distance metric.

15. The digital logic device as in claim 12, wherein said compare logic circuitry includes as shifter/counter to accumulate the results of comparisons.

16. The digital logic device as in claim 15, wherein said distance metric is a Manhattan distance metric.

17. A digital logic device comprising:
- a serial input to the digital logic device;
- a serial content-addressable memory (CAM) containing at least one set of items;
- logic circuitry configured to perform operations in parallel between data from said serial input and at least a subset of said set of items from a serial CAM and further configured based on a serial ordering used to order.

18. The digital logic device as in claim 17, wherein an input vector to the logic circuitry is ordered into groups of bits, one bit from each coordinate of an item associated with said set of items, in order from most to least significant bit.

19. The digital logic device as in claim 17, wherein said items in said set of items are ordered into groups of bits, one bit from each coordinate of an item, in order from most to least significant bit.

* * * * *